(12) United States Patent
Koper

(10) Patent No.: US 6,403,989 B1
(45) Date of Patent: Jun. 11, 2002

(54) SEMICONDUCTOR DEVICE, METHOD OF MANUFACTURING SAME, AND CIRCUIT PROVIDED WITH SUCH A DEVICE

(75) Inventor: Nicolaus A. M. Koper, Stadskanaal (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/691,829

(22) Filed: Oct. 19, 2000

(30) Foreign Application Priority Data

Oct. 20, 1999 (EP) .............................................. 99203444

(51) Int. Cl.[7] .............................................. H01L 29/74
(52) U.S. Cl. .................................................... 257/155
(58) Field of Search .............................. 257/155; 357/58

(56) References Cited

U.S. PATENT DOCUMENTS

| 3,984,858 A | * | 10/1976 | Cornu et al. | ................... 357/58 |
| 4,476,481 A |   | 10/1984 | Iesaka et al. | ................... 357/58 |
| 4,594,602 A | * | 6/1986 | Iimura et al. | ................... 357/13 |
| 5,705,847 A | * | 1/1998 | Kashiwa et al. | ............ 257/476 |

FOREIGN PATENT DOCUMENTS

WO        9816951 A1     4/1998

* cited by examiner

Primary Examiner—David Nelms
Assistant Examiner—Thao P. Le
(74) Attorney, Agent, or Firm—Steven R. Biren

(57) ABSTRACT

The invention relates to a semiconductor device (10) comprising a semiconductor body (11) including, in succession, a first and a second semiconductor region (1, 2) of a first conductivity type having, respectively, a high and a low doping concentration, and including a third semiconductor region (3) of a second conductivity type, opposed to the first conductivity type, having a high doping concentration, whereby at least in the second semiconductor region (2) the lifetime of the charge carriers is reduced, and the first and third semiconductor region (1, 3) are provided with, respectively, a first and a second connection conductor (4, 5).

According to the invention, the thickness of the second semiconductor region (2) is reduced to below 20 $\mu$m, and the service life of the charge carriers in the second semiconductor region (2) is reduced to below 20 nsec. This device is characterized by its high speed, its suitability for low-voltage applications and its surprisingly low forward voltage drop. As, in addition, it is very easy to manufacture, it forms an attractive alternative to, for example, a Schottky diode, which is relatively expensive.

6 Claims, 2 Drawing Sheets

SEMICONDUCTOR DEVICE, METHOD OF MANUFACTURING SAME, AND CIRCUIT PROVIDED WITH SUCH A DEVICE

BACKGROUND OF THE INVENTION

The invention relates to a semiconductor device comprising a semiconductor body including, in succession, a first and a second semiconductor region of a first conductivity type having, respectively, a high and a low doping concentration, and including a third semiconductor region of a second conductivity type, contrary to the first conductivity type, and having a high doping concentration, at least in the second semiconductor region, the service life of the charge carriers being reduced, and the first and the third semiconductor region being provided with, respectively, a first and a second connection conductor.

Such a device is used as a switching diode, for example in a power supply, and also operates very well at high frequencies, while, in addition, the forward voltage drop is low.

Such a diode is disclosed in United States patent specification U.S. Pat. No. 4,594,602, published on Jun. 10, 1986. Said document describes a diode having an $n^{++}$ substrate on which a thick $n^+$ epitaxial layer and a thinner n epitaxial layer are situated, which form a first and a second semiconductor region of the diode. In the n epitaxial layer there is a local $p^+$ diffusion which forms a third semiconductor region of the diode. This region is provided with a connection conductor as is, via the substrate, the first semiconductor region.

A drawback of the known device resides in that it is only extremely suitable for use at a high voltage. In accordance with the above-mentioned patent specification, a Schottky diode can suitably be used as an alternative for low-voltage applications. Such a diode is comparatively expensive, however, as a result of the specific production steps required to manufacture a Schottky diode.

SUMMARY OF THE INVENTION

Therefore, it is an object of the invention to provide a diode which, like a Schottky diode, can suitably be used for low-voltage applications, and which is inexpensive and, otherwise, has favorable properties, such as a high switching speed and a low forward voltage drop.

To achieve this, a device of the type mentioned in the opening paragraph is characterized in accordance with the invention in that the thickness of the second semiconductor region is reduced to below 20 µm, and the service life of the charge carriers in the second semiconductor region is reduced to below 20 nsec. By virtue of such a substantial reduction of the service life of the charge carriers in the second semiconductor region and such a small thickness of the second semiconductor region, the diode in accordance with the invention, just like a Schottky diode, is capable of switching very rapidly. In addition, a diode in accordance with the invention operates at relatively low reverse voltages of, for example, 10 to 100 V. Very surprisingly, it has been found that such a diode also has a very low forward voltage drop, which is very important. As a result, the invention is based on the following, surprising recognition. In a pn diode having a relatively thick base layer (i.e. the second semiconductor region), the reduction of the service life of the charge carriers leads to an increase of the forward voltage drop, while, on the contrary, in a device in accordance with the invention, said reduction of the service life of the charge carriers leads to a reduction of the forward voltage drop. This can be attributed to the fact that a reduced service life of charge carriers gives rise to an increased recombination current in the base layer, while the resistance in the neutral part of the diode does not increase appreciably by the reduction of the service life of the charge carriers. This is in contrast to diodes wherein the base layer is relatively thick. In this respect, it is also important that it is the neutral part of the diode which is responsible for the series resistance of the diode. The forward voltage drop of a device in accordance with the invention thus comes close to a value which is customarily found in a Schottky diode. As a result, a device in accordance with the invention is an attractive alternative to a Schottky diode.

Particularly favorable results are obtained if the thickness of the second semiconductor region is less than 5 µm, and the service life of the charge carriers in that region is less than 5 nsec. A lower limit of the thickness is approximately 0.5 µm because at an even smaller thickness, the maximally attainable reverse voltage becomes impractically low, while a practical lower value of the service life is approximately 1 nsec. Very attractive results are obtained within a range which is approximately a factor of 2 to 5 larger than said lower limits.

Platinum atoms prove to be very suitable for obtaining said short service life of the charge carriers in the second semiconductor region. Surprisingly, it has been found that by using these atoms, are not only the desired short service life can be obtained but also the characteristics of the device are not adversely influenced. This is exceptional, because both the second and the third semiconductor region of a device in accordance with the invention are very thin. Another attractive way of achieving the intended low service life of the charge carriers consists in exposing the semiconductor body to radiation with electrons or protons.

A preferred application of a device in accordance with the invention relates to the use thereof as a fast rectifier diode in (the secondary side of) a so-called SMPS (=Switch Mode Power Supply) unit. A so-called flyback converter and a so-called buck converter are examples of such a SMPS unit. This is a very attractive application because as a result of the ongoing miniaturization, the switching frequencies in a SMPS unit are very high so that rapidly switching diodes with a minimal power dissipation and hence a minimal forward voltage drop are necessary. Owing to the very large market for such diodes having a high switching speed, the price of a device in accordance with the invention is an important advantage in this case.

These and other aspects of the invention will be apparent from and elucidated with reference to the embodiment described hereinafter.

The Figures are diagrammatic and not drawn to scale; particularly the dimensions in the thickness direction are exaggerated strongly for clarity. Semiconductor regions of the same conductivity type are generally hatched in the same direction.

DESCRIPTION OF THE PREFERRED EMBODIMENT

Figure 1:
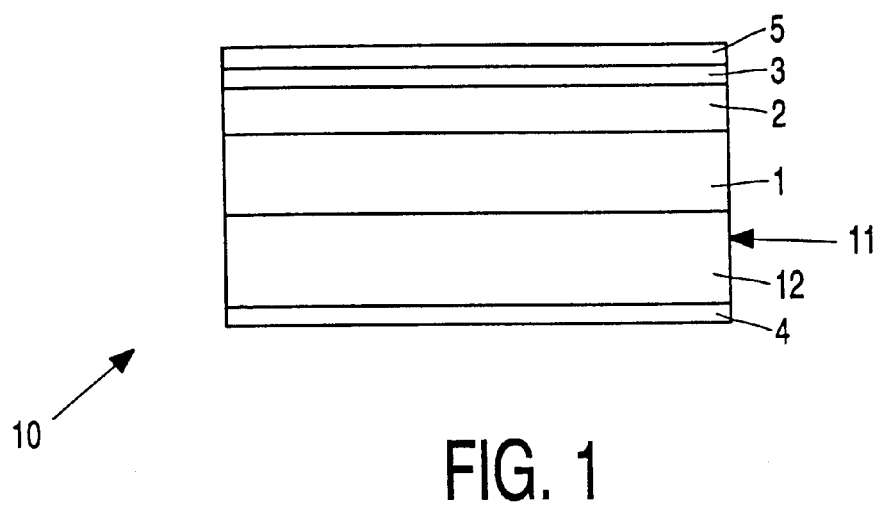
FIG. 1 is a diagrammatic, cross-sectional view, at right angles to the thickness direction, of an embodiment of a device in accordance with the invention, FIG. 2 diagrammatically shows the doping concentration of the device shown in FIG. 1 as a function of the thickness, FIG. 3 diagrammatically shows the variation of the forward voltage of the device shown in FIG. 1 as a function of the service life of the charge carriers for different thicknesses of the second semiconductor region, and FIG. 4 diagrammatically shows the concentration of platinum atoms in the device shown in FIG. 1 as a function of the thickness.

FIG. 1 is a diagrammatic, cross-sectional view, at right angles to the thickness direction, of an embodiment of a device 10 in accordance with the invention. The device comprises a semiconductor body 11 of silicon with a substrate 12 which, in this case, is 200·μm (?, zie tekst blz. 3 r. 27) thick and which includes, in this case, antimony $n^{++}$-doped silicon, and which has a resistivity of 6–20 m·cm. The semiconductor body 11 comprises a first semiconductor region 1 of a first, in this case $n^+$, conductivity type, which forms part of the substrate 12. Adjacent thereto is a second semiconductor region 2 which is also of the first conductivity type, in this case the n-conductivity type, and which, in this case, is an epitaxial layer 2 having a higher doping concentration N and a smaller thickness d than the first semiconductor region 1. Adjacent the second semiconductor region 2 is a third semiconductor region 3 of a second, opposite conductivity type, in this case the p-conductivity type, having a high doping concentration. In this example, the third semiconductor region 1 is formed by a diffusion of boron atoms across a part of the thickness of the epitaxial layer 2. The first and the third semiconductor region 1, 3 are provided with connection conductors 4, 5, respectively, in the form of metal layers 4, 5 which contain Ti, Ag and Al, and which are approximately 5 μm thick.

In accordance with the invention, the thickness of the second semiconductor region 2 is reduced to below 20 μm, and the service life of the charge carriers in the second semiconductor region 2 is reduced to below 20 nsec. As a result of this substantial reduction of the service life of the charge carriers in the second semiconductor region 2 and the small thickness of said second semiconductor region 2, the device 10 in accordance with the invention, like a Schottky diode, is capable of switching very rapidly. In addition, a device 10 in accordance with the invention operates at relatively low voltages of, for example, 10 to 100 V. Very surprisingly, it has been found that the device 10 in accordance with the invention also has a very low forward voltage drop. This is very important because the forward voltage drop substantially determines the power dissipation in the diode 10 and hence in the application wherein the diode 10 is employed.

All of the above is based on the following surprising recognition. In the case of a pn-diode 10 having a relatively thick (i.e. thicker than 20 μm) second semiconductor region 2, the reduction of the service life of the charge carriers leads to an increase of the forward voltage drop, while, on the contrary, in a device 10 in accordance with the invention, said reduction of the service life of the charge carriers leads to a reduction of the forward voltage drop. This can be attributed to the fact that such a reduced service life of charge carriers leads to an increased recombination current in the second semiconductor region 2, while, on the other hand, the resistance in the neutral part of the diode 10 is not noticeably increased by the reduction of the service life of the charge carriers. This is in contrast with the known device wherein the semiconductor region 2 is relatively thick. It should be borne in mind that just the part of the second semiconductor region 2 which in forward operation is not essential to the operation of the diode 10, but which is necessary for obtaining a sufficiently high reverse voltage, is responsible for the series resistance.

Consequently, apart from a high switching rate comparable to that of a Schottky diode, the device 10 in accordance with the invention also has a very low forward voltage drop. Dependent upon the practical operating conditions and the maximum reverse voltage, this forward voltage may range between 0.6 and 0.9 V, which is a very favorable value in practice. As a result, the device 10 in accordance with the invention forms a very attractive alternative to a Schottky diode, for example as a fast rectifier diode in the secondary side of a Switch Mode Power Supply unit, such as an (insulated) flyback converter or buck converter.

Figure 2:
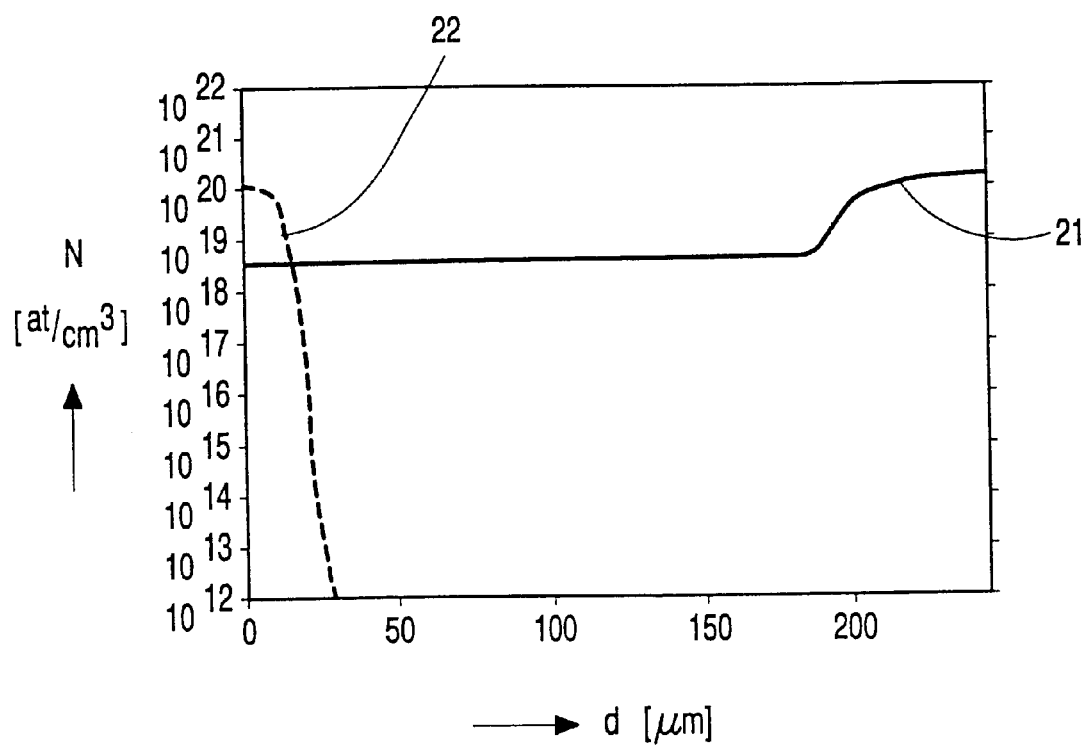

FIG. 2 shows the doping concentration N of the device shown in FIG. 1 as a function of the thickness. The Figure shows (see curve 21) that, in this example, the thickness and the doping concentration of the first semiconductor region 1 are, respectively, 200 μm and $4 \times 10^{18}$ at/cm$^3$. For the second semiconductor region 2, these values are, respectively, 3 μm and $10^{15}$ at/cm$^3$. For the third semiconductor region (see curve 22), these values are, respectively, 25 μm and $10^{17}$ to $10^{20}$ at/cm$^3$. The breakdown voltage of such a diode 10 is approximately 70 V and the forward voltage drop does not exceed approximately 0.75 V. Favorable results are also obtained if the thickness of the second semiconductor region lies in the range between 1 and 20 μm. The effect of the measures in accordance with the invention will be illustrated again hereinbelow.

Figure 3:
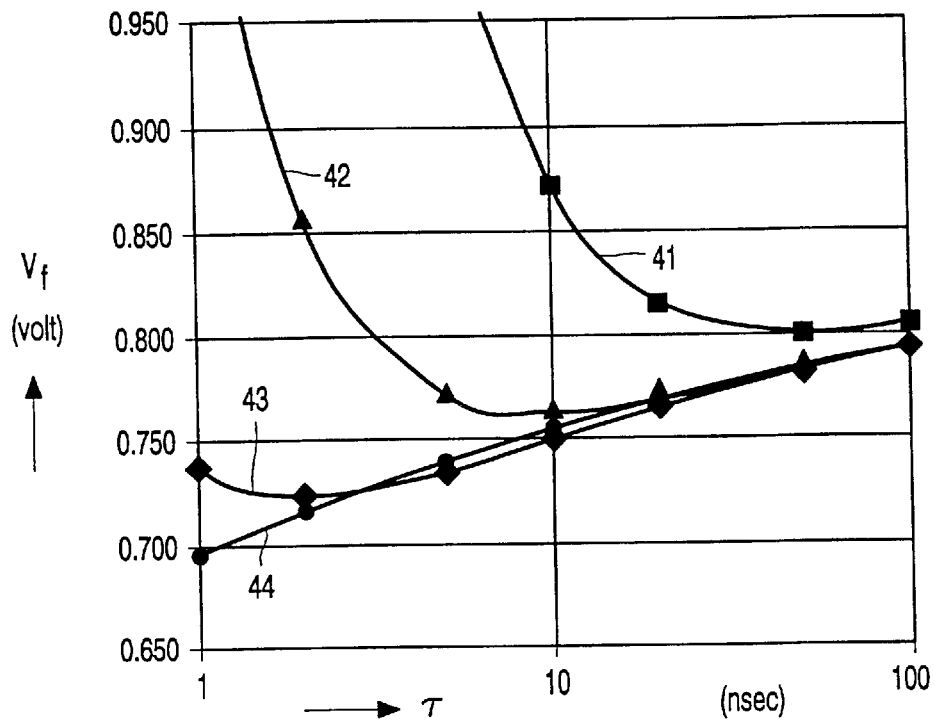
Figure 4:
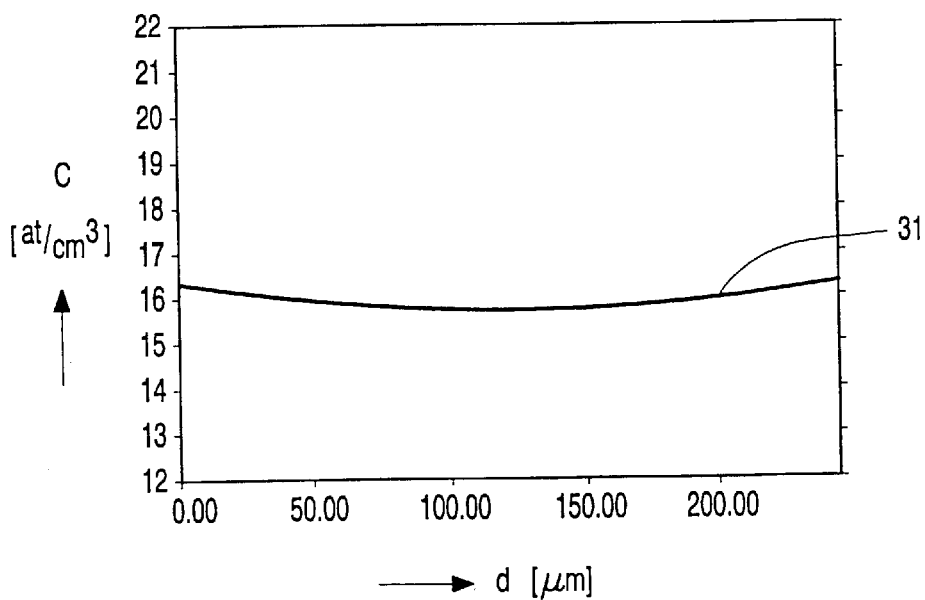

FIG. 3 diagrammatically shows the variation of the forward voltage $V_f$ of the device shown in FIG. 1 as a function of the service life τ of the charge carriers in the second semiconductor region 2 for different thicknesses of the second semiconductor region 2. The curves 41, 42, 43 and 44 refer to a thickness of the semiconductor region 2 of, respectively, 20, 10, 5 and 2 μm. The variation of the curves 41 through 44 clearly shows that in a device in accordance with the invention wherein the thickness of the second semiconductor region 2 is reduced to below 20 μm and, simultaneously, the service life τ of the charge carriers has been reduced to below 20 nsec, a substantial reduction of the forward voltage $V_f$ can surprisingly be obtained.

The dimensions of the device 10 of this example (and of devices compared thereto) are 800×800·m$^2$. The active region of the diode 10 corresponds to the surface thereof.

The device 10 shown in FIG. 1 is manufactured in the following manner using a method in accordance with the invention. There is started from (see FIG. 1) an n-type (111) silicon substrate 12 having a diameter of 4 inch on which an n-type epitaxial layer 2 is provided by means of an atmospheric VPE (=Vapor Phase Epitaxy) process at a temperature of 1150° C. The growth rate at this temperature is approximately 1 to 2 μm/min. At the upper side of the resultant structure a p-type layer 3 is formed by means of a boron diffusion. Simultaneously, an increased concentration of an n-type dopant is provided at the lower side by a phosphor diffusion in order to reduce the contact resistance with the connection conductor 4. Thicknesses and doping concentrations are chosen as indicated hereinabove.

Subsequently, platinum atoms are introduced into the semiconductor body 11 by means of diffusion. This results in the variation of the platinum concentration, referenced 31 in FIG. 3, as a function of the thickness in the semiconductor body 11. As a result thereof, the extremely low service life of charge carriers in the range from 1 to 20 nsec in the semiconductor body 11 is obtained. It has been found that in spite of this treatment, the profile of the doping concentration vis-à-vis the thickness as shown in FIG. 2 remains sufficiently intact.

Subsequently, the semiconductor body 11 is metallized on two sides. Dependent upon the way in which the end assembly is conducted, a mesa-shaped structure is provided, or not, on the silicon substrate 12, which structure is passivated in various ways, customarily by using silicon dioxide and a so-called dispense technique. Next, the semiconductor body 10 is separated, resulting in the formation of individual diode crystals 10. After end assembly of the device 10 in an envelope, this device is ready for mounting, for example, on a PCB (=Printed Circuit Board).

The invention is not limited to the above example because, within the scope of the invention, many variations and modifications are possible to those skilled in the art. For example, the compositions and thicknesses of the various (semiconductor) regions or layers may differ from those mentioned in the example. It is also possible to use deposition techniques other than those mentioned. Particularly, for example, the third semiconductor region 3 can alternatively be formed by means of epitaxy. In addition, all conductivity types can be simultaneously changed into the opposite conductivity type. Also regarding the structure and the manufacture of the device 10 of the example, many modifications are possible. Apart from a mesa structure, a planar structure having a so-called guard ring may be chosen. The third semiconductor region 3 may (then) also be provided locally instead of throughout the service of the semiconductor body.

Although the invention aims particularly at so-called discrete devices, a device in accordance with the invention may also be a device which is more complex than a single diode-containing device.

What is claimed is:

1. A semiconductor device (10) comprising a semiconductor body (11) including, in succession, a first and a second semiconductor region (1, 2) of a first conductivity type having, respectively, a high and a low doping concentration, and including a third semiconductor region (3) of a second conductivity type, contrary to the first conductivity type, and having a high doping concentration, at least in the second semiconductor region (2), the service life of the charge carriers being reduced, and the first and the third semiconductor for region (1, 3) being provided with, respectively, a first and a second connection conductor (4, 5), characterized in that the thickness of the second semiconductor region (2) is reduced to below 20 $\mu$m, and the service life of the charge carriers in the second semiconductor region (2) is reduced to below 20 nsec.

2. A semiconductor device as claimed in claim 1, characterized in that the thickness of the second semiconductor region (2) is less than 5 $\mu$m, and the service life of the charge carriers in that region is less than 5 nsec.

3. A semiconductor device as claimed in claim 1, characterized in that the thickness of the second semiconductor region (2) ranges between 1 and 2 $\mu$m, and the service life of the charge carriers in the second semiconductor region (2) ranges between 1 and 2 nsec.

4. A semiconductor device as claimed in claim 1, characterized in that at least the second semiconductor region (2) contains atoms of a heavy metal to reduce the service life of the charge carriers.

5. A semiconductor device as claimed in claim 1, characterized in that at least the second semiconductor region (2) is exposed to radiation with electrons or protons to reduce the service life of the charge carriers.

6. An electronic circuit for a power supply comprising a transformer with a first and a second coil, the second coil being connected in series with a semiconductor device, characterized in that the secondary coil is connected to a semiconductor device as claimed in claim 1.

* * * * *